United States Patent
Kellermann

(10) Patent No.: US 11,764,031 B2
(45) Date of Patent: Sep. 19, 2023

(54) METHOD FOR MICROSCOPIC IMAGE GENERATION AND SYSTEM FOR SAME

(71) Applicant: LEICA MIKROSYSTEME GMBH, Vienna (AT)

(72) Inventor: Peer Oliver Kellermann, Vienna (AT)

(73) Assignee: Leica Mikrosysteme GmbH, Vienna (AT)

( * ) Notice: Subject to any disclaimer, the term of this patent is extended or adjusted under 35 U.S.C. 154(b) by 250 days.

(21) Appl. No.: 17/425,420

(22) PCT Filed: Jan. 30, 2020

(86) PCT No.: PCT/EP2020/052320
§ 371 (c)(1),
(2) Date: Jul. 23, 2021

(87) PCT Pub. No.: WO2020/157214
PCT Pub. Date: Aug. 6, 2020

(65) Prior Publication Data
US 2022/0189730 A1     Jun. 16, 2022

(30) Foreign Application Priority Data
Jan. 31, 2019   (DE) .................... 10 2019 102 438.2

(51) Int. Cl.
*H01J 37/22*     (2006.01)
*H01J 37/28*     (2006.01)

(52) U.S. Cl.
CPC .......... *H01J 37/222* (2013.01); *H01J 37/28* (2013.01); *H01J 2237/2802* (2013.01)

(58) Field of Classification Search
CPC .. H01J 37/00; H01J 37/02; H01J 37/22; H01J 37/222; H01J 37/26; H01J 37/28; H01J 2237/2802; G02B 21/365; G02B 21/24
(Continued)

(56) References Cited

U.S. PATENT DOCUMENTS 4,967,825 A * 11/1990 Brown, Jr. ............. B22D 23/00
                                                        977/890
5,905,266 A      5/1999 Larduinat et al.
(Continued)

FOREIGN PATENT DOCUMENTS

DE     112010005353 T5    1/2013
DE     102015100727 A1    7/2016
(Continued)

OTHER PUBLICATIONS

Liv et al., "Simultaneous Correlative Scanning Electron and High-NA Fluorescence Microscopy," PLoS ONE, Feb. 2013, vol. 8, No. 2, e55707, 9 pages.

*Primary Examiner* — Jason L McCormack
(74) *Attorney, Agent, or Firm* — Hodgson Russ LLP

(57) ABSTRACT

The present invention concerns a method and a system for imaging at least a part of a specimen by means of two microscopy imaging methods, where a surface (11) of the specimen (10) is imaged by means of a first microscopy imaging method, where a replica (25) of the surface (11) to be imaged by means of the first microscopy imaging method is produced and this replica (25) is simultaneously imaged by means of a second microscopy imaging method, where the images produced by means of the first and the second microscopy imaging methods are overlaid at the correct scale.

9 Claims, 1 Drawing Sheet

(58) Field of Classification Search
USPC .......................................... 250/306, 307, 311
See application file for complete search history.

(56) References Cited

U.S. PATENT DOCUMENTS

| | | | |
|---|---|---|---|
| 6,261,628 | B1 | 7/2001 | Howie |
| 2004/0240049 | A1* | 12/2004 | Krueger .................. G02B 5/04 |
| | | | 359/373 |
| 2010/0091362 | A1 | 4/2010 | Isozaki et al. |
| 2014/0142016 | A1 | 5/2014 | Tomokuni et al. |
| 2014/0291514 | A1 | 10/2014 | Gong et al. |
| 2018/0356624 | A1 | 12/2018 | Isobe et al. |
| 2018/0364563 | A1* | 12/2018 | Virdi ..................... G01N 23/203 |

FOREIGN PATENT DOCUMENTS

| | | |
|---|---|---|
| EP | 0799434 B1 | 10/1997 |
| WO | 03/034097 A2 | 4/2003 |

\* cited by examiner

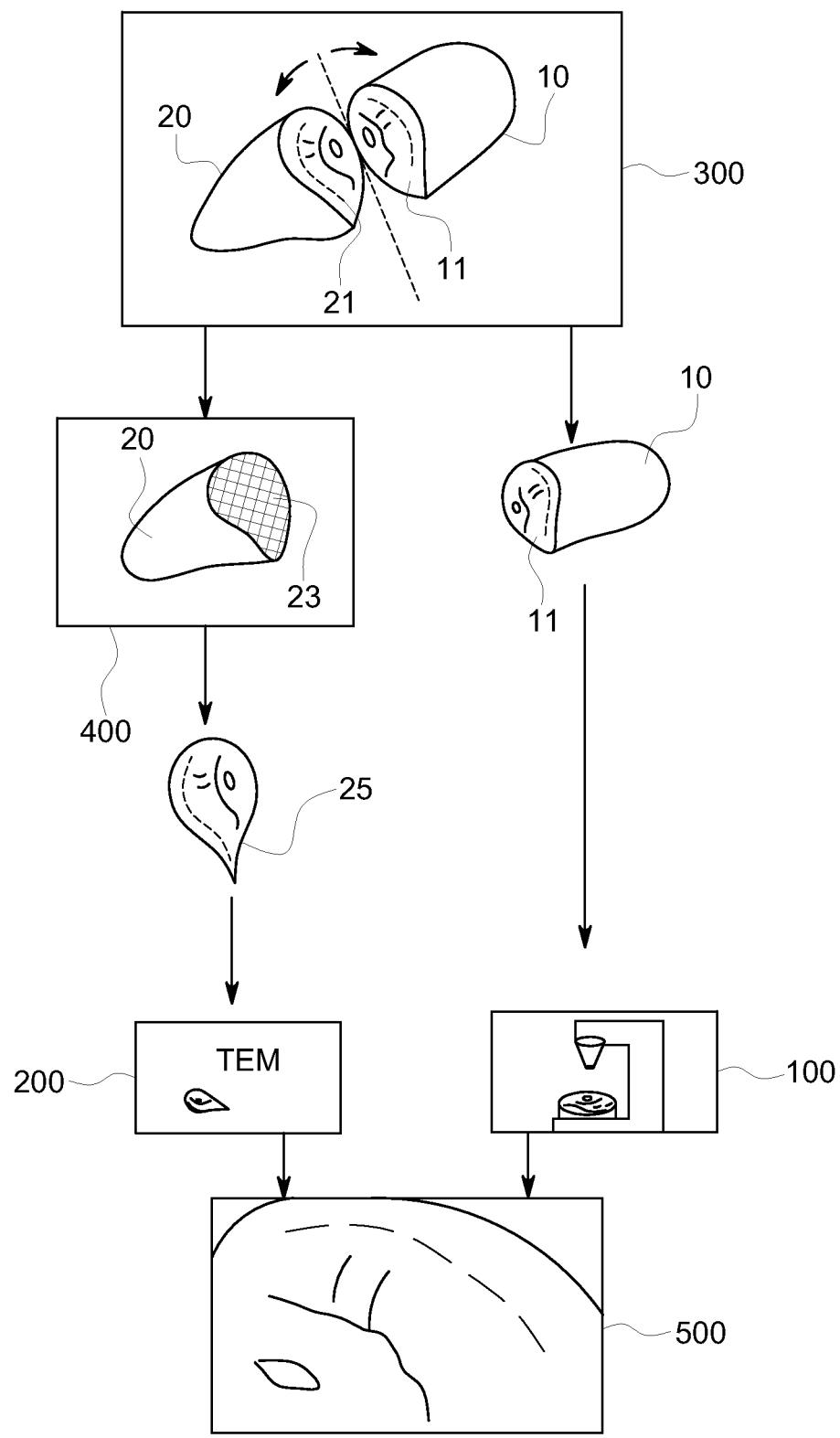

METHOD FOR MICROSCOPIC IMAGE GENERATION AND SYSTEM FOR SAME

CROSS-REFERENCE TO RELATED APPLICATIONS

The present application is the U.S. national phase of International Application No. PCT/EP2020/052320 filed Jan. 30, 2020, which claims priority of German Application No. 10 2019 102 438.2 filed Jan. 31, 2019, the entire disclosure of which is incorporated herein by reference.

FIELD

The present disclosure concerns a method for microscopic image production and a system therefor. The disclosure concerns in particular a method for imaging a specimen by means of two microscopy imaging methods, where for at least one of the imaging methods a high-resolution microscope, such as for example an electron microscope, is used.

STATE OF THE ART

In this context there is known for example correlative light-electron microscopy (CLEM), in which a specimen is first examined with a fluorescence microscope in order to be able to identify and label potentially interesting regions of the specimen. The specimen is subsequently mounted in an electron microscope, in which the labeled regions of the specimen are imaged in the nanometer range at a resolution that is increased manifold. Since the electron microscopy examination takes place in vacuum, the specimen has to be stable in vacuum. Moreover, normally the specimen has to be provided with a very thin layer of a noble metal (for example, platinum) and/or vapor-coated with carbon. Biological specimens are frequently cryofixed. Here the specimen is flash-frozen, for example in liquid ethane below −135° C. The water does not thereby crystalize out, but instead forms vitrified (glass-like) ice. Since for the particular imaging method the specimen normally has to be taken from a first microscope (for example, fluorescence microscope) to a second microscope (for example, electron microscope), care has to be taken that as far as possible the specimen does not undergo a change during the transfer process. In already cryofixed samples, it has to be insured that the specimen's transfer also takes place under cryogenic conditions. In the CLEM method, the first image of the specimen obtained by means of the optical microscope (for example, fluorescence microscope) is overlaid with the second image obtained through the second microscope (electron microscope). In doing so, reference points in the first image are aligned through scaling processes with the corresponding reference points in the second image, such that both images can be viewed laid one on top of the other at the correct scale.

In this CLEM method, the sequential observation has an especially detrimental effect. Because of the high magnification of such microscopes and the associated vast dimensions of the nano-universe, and the mostly limited operating times possible in practice, users have to restrict themselves when selecting the areas to be visualized. In the first microscope (for example, fluorescence microscope), areas of the specimen are sought and thoroughly visualized in which it is to be expected that new relationships would be deducible after imaging by the second microscope (for example, electron microscope). For the choice of areas, consequently, a more or less accurate experience-based assumption has to be made. In part, however, the chosen areas prove to be uninteresting under the second microscope. On the other hand, relationships can remain undiscovered that are located in areas which based on the imaging under the first microscope were rated as uninteresting. A further drawback, in addition to the already addressed specimen transfer, is also the associated expenditure of time for the user, who has to view the same area twice in succession. Finally, the specimen has to be resistant to the basic conditions of both microscopes, whereby often restrictions arise as to the type of specimens. The already addressed transfer of the specimen between the two microscopes is costly of resources and furthermore involves the risk of damage.

Integrated CLEM systems are also known from the state of the art, see e.g. Liv, N., Zonnevylle, A. C., Narvaez, A. C., Effting, A. P., Voorneveld, P. W., Lucas, M. S., Hardwick, J. C., Wepf, R. A., Kruit, P., Hoogenboom, J. P. (2013) "Simultaneous correlative scanning electron and high-NA fluorescence microscopy", *PloS one*, 8(2), e55707, in which at room temperature a specimen is imaged microscopically simultaneously with the help of an electron beam and with the help of an optical light beam. To this end both microscopes exhibit a common specimen chamber. The cost in resources of the specimen's transfer and the associated risks of damage and/or of changes to the specimen are eliminated in such a system. However, the specimen chamber has to be designed in such a way that the requirements of the two combined microscopes are met. Thereby technical compromises have to be made that fall significantly below the possibilities of the individual high-end microscopes. Since retrospective integration of two such microscopes is not possible, the user and/or the laboratory has to purchase a new combined instrument. Once again the specimen has to be resistant to the basic conditions of the combined microscopes. Consequently, drawbacks continue to exist in an integrated CLEM system too.

A method is known from EP 0799434 B1 for overlaying a microscopic image with a further image, using an adaptive control device.

According to DE 112010005353 T5, an optical imaging device is integrated into the vacuum specimen chamber of an electron microscope.

Overall, there exists a need for higher flexibility, whether in regard to the utilized microscopy imaging method or in regard to the specimens that are to be examined. Here the advantage of simultaneous viewing of the image data of two microscopes, in particular also live viewing, should be maintained, since through the simultaneous viewing of all the information new relationships can be discovered in a simple and time-saving way. The main problem here is the simultaneous imaging of one and the same specimen by means of two different microscopy imaging methods.

SUMMARY

The aforementioned task is solved by means of a method and a system in accordance with the independent patent claims. Advantageous embodiments arise from the respective dependent claims and from the following description.

DISCLOSURE

The disclosure's method for imaging at least a part of a specimen by means of two microscopy imaging methods is based on the idea of imaging a surface of the specimen by means of a first microscopy imaging method, and for a second microscopy imaging method using a replica of this surface of the specimen, such that the microscopic examination of this replica can take place spatially independently and separately from the microscopic examination of the surface of the specimen, where nevertheless one and the same specimen surface can be simultaneously imaged with two in particular different methods and (simultaneously or subsequently) examined. To this end, according to the disclosure first a replica of the specimen surface to be examined is produced. Subsequently, this replica is imaged by means of a second microscopy imaging method, where the two microscopic examinations by means of the first and second microscopy imaging methods take place simultaneously, i.e. at the same time. Thereafter the two images generated by means of the first and the second imaging method are brought together via data transfer and overlaid at the correct scale.

Consequently, thanks to the disclosure one and the same specimen surface can be imaged simultaneously with two different microscopy imaging methods, without this—as in the state of the art—having to take place in a single specimen chamber that meets the requirements of both respective microscopes.

The observer of the images can freely select such a section of the specimen, in particular viewed live and simultaneously with two microscopes, for example by means of repositioning or magnifying. In the context of the disclosure, however, it is also possible to dispense with live viewing, in order to make possible also temporally independent microscopic examinations, for example after recording the image.

With the present disclosure, in particular, new features (points of interest) can also be detected more rapidly by navigating in the 'nano-universe' of the two overlaid, simultaneously viewed images.

In principle, all known optical microscopy or electron microscopy imaging methods are an option for the first microscopy imaging method. For the second microscopy imaging method, again in principle all known optical or electron microscopy imaging methods are an option, where in particular a different imaging method than the first one should be used in order to record an appropriate information gain. When using two identical microscopy imaging methods, their performance can be compared. One of the two in particular non-identical microscopy imaging methods should in particular be more highly resolving than the other. Specifically, for the second microscopy imaging method, which examines the replica, the present disclosure proposes using an electron microscopy imaging method, in particular involving the use of a transmission electron microscope (TEM), as elucidated in detail further below.

It should also be emphasized that more than two microscopy imaging methods can be used in accordance with the disclosure. Thus further imaging methods can also be used for imaging the specimen and/or the replica, in order for example to obtain more accurate or additional data about the surfaces. In the context of this application, the term 'microscopy imaging method' also comprises image processing or image optimization methods, which where appropriate are additionally applied to the microscopic raw images. Where appropriate, data from further microscopy methods could also be incorporated here, e.g. from a combination of different microscopy methods. The term 'microscopy imaging method' should thus be understood completely generally as a combination of one or several microscopy imaging methods with where appropriate image processing methods and potentially also further supplementary data.

Furthermore, in the context of the disclosure the images generated by means of the respective microscopy imaging methods do not have to image identical surface regions, but rather can also image different but overlapping surface regions which then are overlaid according to the disclosure at least in the region of the overlap.

Instead of an electron microscope or in addition to it, in the context of this application one or several other high-resolution (optical) microscopy methods, such as STED (stimulated emission depletion), GSD (ground state depletion), or RESOLFT (reversible saturable optical linear fluorescence transitions) microscopy can also be used.

The replica of the surface of the specimen is usefully produced from a specimen surface complementary to this surface of the specimen. Such a complementary specimen surface can be obtained for example from an impression (or an equivalent method) of the surface of the specimen. On the other hand, the surface of the specimen can also be measured and/or scanned point by point, in order for example to obtain a replica and/or a duplicate of this surface of the specimen by means of an additive fabrication method. A further way, in the present application especially preferred, of producing both the surface of the specimen and the replica of the surface of the specimen is that of fracturing. When fracturing an object into two object parts, two surfaces complementary to each other are formed along the fracture site. One of these two surfaces constitutes in the present case the surface to be imaged of the specimen; the specimen surface complementary to this surface can advantageously be used to produce the replica of the surface of the specimen, and in the normal case is dissolved in acid together with the specimen in order to separate the replica.

Methods for producing high-resolution replicas for electron microscopy are described in U.S. Pat. No. 4,967,825.

The fracturing of the object described here is carried out in particular in a freeze fracturing machine which is known per se. In this machine, an object is fractured under cryogenic conditions into two parts at an interesting location along a fracture line. Typical temperatures in this connection lie between −100° C. and −200° C., preferably in the range from −130° C. to −150° C. By coating the complementary specimen surface, a replica of the surface of the specimen can be obtained in a simple way. Here the complementary specimen surface is coated with a noble metal, in particular platinum. Typical layer thicknesses are approximately 2 nm. A carbon layer can additionally be applied for protection (typical layer thickness approximately 20 nm). Replicas produced in this way can be examined and imaged in a known way under a transmission electron microscope. For contrast enhancement, a known method is for example to apply the coating through oblique evaporation. The transmission electron microscopy imaging can take place at room temperature. In particular, this second microscopy imaging can take place spatially separated from (but in the data transfer linked with) the first microscopy imaging, such that the greatest possible flexibility is achieved here. Both microscopy imaging procedures take place at the same time (simultaneously), where however the overlaying of the generated images and/or the viewing of the overlaid images can take place temporally shifted (i.e. there is then no live viewing). All specimens whose surface to be imaged is suitable for the production of a replica are suitable as specimens. In this respect, high flexibility is assured with regard to the choice of specimens also.

As already mentioned, it is advantageous to use as the first microscopy imaging method an optical microscopy, in particular fluorescence microscopy imaging method or an electron microscopy, in particular scanning electron microscopy imaging method. The surface to be imaged of the specimen is coated in the same way as that for the second imaging method, coated differently, or not coated, depending on the process parameters optimized for this first imaging method.

In order to produce the replica by fracturing an object into two parts, the specimen or the object respectively has to be brittle. If an object is sufficiently brittle at room temperature to be fractured, cryo-fracturing is not necessary and microscopic examination at room temperature is possible. In the case of specimens not containing water or ice, one can for example also fracture cryogenically and examine by microscope at room temperature. In the case of specimens containing water or ice, normally the required brittleness is achieved only under cryogenic conditions, and the specimen is then normally also viewed microscopically under cryogenic conditions.

For example, it is useful to examine and image a vitrified specimen and/or the surface of this specimen by fluorescence microscopy after staining. In parallel, the replica of this surface, as elucidated above in detail, is produced and then preferably examined and imaged by transmission electron microscopy. These two images which differ in their information content are overlaid at the correct scale and can be presented to a user on a screen, for example as a live image. In so doing, preferably over the particular section being viewed (live) of the specimen surface imaged by fluorescence microscopy there is laid the corresponding section of the transmission electron microscopy image. In this way, an observer can simultaneously assess and/or evaluate the information contents of both images, without this having to take place consecutively in time.

If for example the second microscopy imaging method is carried out at room temperature, the first microscopy imaging method in contrast at low temperatures or cryogenic temperatures, it is useful to compensate for the change in size by way of expansion of one of the two images due to the temperature differences before their overlaying. On the other hand, it is also possible to perform the true-to-scale overlaying of the two images by means of the known approach of the CLEM method elucidated at the beginning. In general, the second microscopy imaging method can also be carried out at low temperatures or cryogenic temperatures. In the present application, this should be understood as a temperature range from approximately −200° C. to approximately −100° C.

When imaging the replica by transmission electron microscopy, mirror-inversion of the replica, i.e. imaging of the turned side of the replica, can make sense in order to obtain an image which better corresponds to the original surface of the specimen as imaged by means of the first microscopy imaging method.

The disclosure further concerns a system for imaging at least a part of a specimen by means of two microscopy imaging methods, where this system exhibits: A first microscope set up for generating a first image of a surface of the specimen by means of a first microscopy imaging method, a second microscope set up for generating a second image of a replica of the surface of the specimen by means of a second microscopy imaging method, where the system is so set up that the first and the second microscopy imaging methods take place simultaneously, i.e. at the same time, and an image overlaying system set up for true-to-scale overlaying of the two images generated by means of the first and the second microscopy imaging methods. In particular, the disclosure's system is set up for implementing the disclosure's method described above in detail. In particular, the disclosure's system comprises a unit for generating a replica of that surface of the specimen which is imaged by means of the first microscopy imaging method.

Elements and properties of the disclosure's system and its components arise from the above description of the disclosure's method in a completely analogous way. In order to avoid repetitions, hereinafter only the essential components and any optional components of such a system are elucidated in greater detail.

It is advantageous if the disclosure's system comprises a fracturing machine, in particular a freeze fracturing machine, which is set up for fracturing an object. Furthermore it is advantageous if the disclosure's system comprises a coating device.

An object can be fractured into two object parts by means of a fracturing machine, as already elucidated above. As a result, two surfaces are created that lie opposite each other and are separated from each other by a fracture gap. The first of these surfaces then corresponds to the surface of the specimen that is to be imaged by means of the first microscopy imaging method. The second surface constitutes a specimen surface complementary to the first surface. This complementary surface can be used to produce, by means of a coating device, a replica of the specimen surface to be imaged, as already elucidated above in detail. When producing the replica, normally the second surface and/or the second object part respectively is lost.

In principle, the first and the second microscope can be of the same type or of different types. Preferably, the second microscope is of a different type and higher-resolving than the first. It is advantageous if the first microscope of the disclosure's system is configured as an optical microscope, in particular as a fluorescence microscope, or as an electron microscope, in particular as a scanning electron microscope. We refer here again to the aforementioned other imaging methods.

It is furthermore advantageous if the second microscope of the disclosure's system is configured as a transmission electron microscope (TEM), in particular as a room temperature transmission electron microscope.

Finally, the disclosure concerns the utilization of such a system as elucidated above for implementing a method according to the disclosure.

It should be understood that the features mentioned in the foregoing and those still to be elucidated hereinafter can be utilized not only in the respectively stated combination, but also in other combinations or in isolation, without leaving the boundaries of the present disclosure.

The disclosure is depicted schematically in the drawing by reference to an embodiment example and is described hereinafter by reference to this drawing.

DESCRIPTION OF THE FIGURES

FIG. 1 shows in schematic depiction a method and a system according to the disclosure for microscopic image generation of at least one part of a specimen.

DETAILED DESCRIPTION

According to the present embodiment example, the system exhibits for the imaging of at least one part of a specimen by means of two microscopy imaging methods a first microscope 100, here a fluorescence microscope, as well as a second microscope 200, here a room temperature transmission electron microscope.

Furthermore the system comprises an image overlaying system 500. A freeze fracturing machine as a further optional component of the system is denoted by 300. A coating device 400 can be integrated into the freeze fracturing machine 300 or be configured separately from it. The individual components of the system depicted schematically in FIG. 1 are each known per se from the state of the art and shall therefore not be described in detail hereinafter.

The method for imaging at least one part of a specimen by means of two microscopy imaging methods, here accordingly a fluorescence microscopy and a transmission electron microscopy imaging method, shall be elucidated in greater detail hereinafter. First an object (here not depicted as a whole) is introduced into the freeze fracturing machine 300, whereby the deep-frozen specimen is broken apart at temperatures in the range from −150° C. to −130° C., such that a first object part 10 and a second object part 20 are created. The two object parts 10 and 20 possess surfaces complementary to each other. The two object parts 10 and 20 are usually held in separate mini-holders (not depicted) adjacent to each other. The surface of the specimen to be imaged in what follows by means of the first microscopy imaging method is denoted by 11. The specimen surface complementary hereto is denoted by 21.

In a second step, at least the complementary specimen surface 21 is coated. The appropriate coating device 400 is normally integrated into the freeze fracturing machine 300. Under cryogenic conditions, the complementary specimen surface 21 is coated for example with platinum with a small layer thickness of approximately 2 nm. A thin carbon layer can additionally be applied for protection. The coating is denoted by 23 in FIG. 1. The surface of the specimen 11 of the first object part 10 can, depending on the process parameters optimized for the first imaging method, be similarly coated (coating device 400) or coated differently after masking the respectively other specimen surface or indeed not coated at all (as depicted in FIG. 1). In the latter case, the surface 11 is for example stained, in order to be able to render structures visible in a fluorescence microscope. In the scanning electron microscope, in contrast, thin (e.g. 2 nm Pt) metal layers mostly prove to be favorable for the imaging method, in order to prevent charging and increase the contrast.

In a third step, the two object parts 10 and 20 are separated from each other. The first object part 10 is for example unloaded from the freeze fracturing machine 300 while maintaining the cryogenic conditions and loaded into a cryogenic first microscope, here a fluorescence microscope 100. The other, second object part 20 is likewise unloaded from the freeze fracturing machine 300 and placed at the disposal of the replica production. The second object part 20 itself is usually dissolved during the replica production. The replica 25 is loaded into a room temperature transmission electron microscope 200 and can thereupon be viewed as customary in this second microscope 200. Here the replica 25 is illuminated from one side and reproduces with the highest accuracy the mirror-inverted or not mirror-inverted surface 11 of the first object part 10 (simultaneously the not mirror-inverted or mirror-inverted surface 21 of the second object part 20), depending on the side from which the replica 25 is illuminated.

In a fourth step, the visualization of the surface 11 of the specimen takes place by having the simultaneously generated data of the two images, namely the first image by means of the first microscope 100 and the second image by means of the second microscope 200, brought together and the images laid over each other, software-aided, in particular live on a monitor at the correct scale, that is, proportionally correct, and displayed. The appropriate image processing takes place in an image overlaying system 500. In principle, the true-to-scale overlaying of two microscopic images is known for example from the technology of correlative light-electron microscopy (CLEM). This technology can also be used in the present case. Optionally, dimensional changes resulting from the different thermal expansions can also be compensated for separately through appropriate scaling (in the form of expansion or dilatation and/or contraction). Where necessary, depending on the side from which the replica 25 is illuminated, software-aided mirror-inversion of the replica 25 is also used in order to be able to image the surface 11.

The method and system described above have the great advantage that although the image of one and the same surface 11 of the specimen is generated, both microscopy imaging methods are run independently from each other, such that spatially separated microscopes can also be used. Especially preferred is the capture of live images by means of the fluorescence microscope 100 or more generally by means of the first microscope 100, on which the high-resolution proportionally correct TEM images are overlaid. The most varied specimens and/or objects can be used for the method and the system, as long as it is possible to produce a replica of the surface to be imaged of the specimen. Apart from that, the specimen only has to be resistant to the examination conditions of the first microscope 100. In contrast to the known CLEM technology, the present method and system can also correlate with each other images from two electron microscopes. A costly specimen transfer is not required.

LIST OF REFERENCE LABELS

10 First object part, specimen
11 Surface of the specimen
20 Second object part
21 Complementary specimen surface
23 Coating
25 Replica
100 First microscope
200 Second microscope
300 Freeze fracturing machine
400 Coating device
500 Image overlaying system

What is claimed is:

1. A system for imaging at least a part of a specimen by means of two microscopy imaging methods, the system comprising:
   a first microscope configured for generating a first image of a surface of the specimen by a first microscopy imaging method,
   a second microscope configured for generating a second image of a replica of the surface of the specimen by a second microscopy imaging method, and
   an image overlaying system configured for true-to-scale overlaying of the first image and the second image,
   wherein the system is configured such that the first and the second microscopy imaging methods take place simultaneously.

2. The system according to claim 1, further comprising a unit for producing the replica of the surface of the specimen imaged by the first microscopy imaging method.

3. The system according to claim 2, wherein the unit for producing the replica comprises a fracturing machine configured for fracturing an object to create the surface of the specimen to be imaged by the first microscopy imaging method and a complementary specimen surface complementary to the surface of the specimen.

4. The system according to claim 3, wherein the unit for producing the replica comprises a coating device.

5. The system according to claim 3, wherein the coating device is configured to coat the complementary specimen surface in order to produce the replica of the surface of the specimen.

6. The system according to claim 1, wherein the first microscope is configured as an optical microscope or as an electron microscope.

7. The system according to claim 1, wherein the second microscope is configured as a transmission electron microscope.

8. The system according to claim 6, wherein the first microscope is configured as a fluorescence microscope or as a scanning electron microscope.

9. The system according to claim 7, wherein the second microscope is configured as a room temperature transmission electron microscope.

* * * * *